United States Patent [19]
Fukaya

[11] 4,001,715
[45] Jan. 4, 1977

[54] VERTICAL DEFLECTION CIRCUIT FOR TELEVISION RECEIVER SET

[75] Inventor: Hirokazu Fukaya, Tokyo, Japan

[73] Assignee: Nippon Electric Company, Limited, Tokyo, Japan

[22] Filed: May 8, 1975

[21] Appl. No.: 575,842

[30] Foreign Application Priority Data

May 8, 1974 Japan .............................. 49-50953

[52] U.S. Cl. .................................. 331/20; 358/158; 331/153; 331/172
[51] Int. Cl.² .......................................... H03B 3/06
[58] Field of Search .................... 331/20, 172, 153; 178/69.5 TV

[56] References Cited
UNITED STATES PATENTS 2,750,498   6/1956   Arbuckle ............................. 331/20
3,441,673   4/1969   Wheatley, Jr. ............. 178/69.5 TV

*Primary Examiner*—John Kominski
*Attorney, Agent, or Firm*—Sughrue, Rothwell, Mion, Zinn & Macpeak

[57] ABSTRACT

A vertical deflection circuit used in television receivers, comprising a free-running oscillator capable of synchronous oscillation triggered by a vertical synchronizing signal separated from a composite synchronizing signal is disclosed. The vertical deflection circuit has a switch means which operates under synchronous control by the vertical synchronizing pulse and prevents the application of a vertical trigger signal to the free-running oscillator at least for the period from the time at which the free-running oscillator has been triggered to the time corresponding to the end of the vertical synchronizing pulse period of the composite synchronizing signal.

5 Claims, 8 Drawing Figures

VERTICAL DEFLECTION CIRCUIT FOR TELEVISION RECEIVER SET

BACKGROUND OF THE INVENTION

1. Field of the Invention

The present invention relates to vertical deflection circuits of television receivers, and more particularly to a vertical deflection circuit capable of preventing jitter of the picture on the screen in the vertical direction.

2. Description of the Prior Art

One of the major causes which detract from the quality of pictures on the screen of a television receiver is jitter. Being a phenomenon of unstable or wavering picture reproduction on the screen, jitter not only disturbs the pleasure of those watching television but is often suspected as a failure originating in a breakdown of some parts in a television receiver set.

A cause of such jitter can be explained by the following explanation which will be described by referring to the appended drawings, FIGS. 1 through 3.

FIG. 1 is a circuit diagram showing a conventional vertical deflection circuit which comprises an integrator 24 used for producing the vertical trigger signal and vertical oscillator 23. The integrator 24 is constructed by a first stage integrator of resistor 1 and capacitor 2 and a second stage integrator of resistor 3 and capacitor 4. The composite signal is fed into the integrator 24 through the input terminal 25, and thus the vertical trigger signal is obtained from the composite signal. The vertical trigger signal is applied to the vertical oscillator 23 through the coupling capacitor 22, and the saw-tooth wave is obtained from the output terminal 26.

Referring now to FIG. 2 (a), the composite synchronizing signal has equalizing pulse periods 100 and 300, vertical pulse period 200 and horizontal pulse period 400. After such composite synchronizing signal is applied to the integrator 24, vertical trigger signal 500 caused by synchronizing pulse 200 and excessive signal 600 caused by equalizing pulse 100 are obtained, as shown in FIG. 2 (b).

FIG. 3 shows the relationship among the vertical trigger signals $P_1$, $P_2$ and $P_3$, voltages $R_1$ and $R_2$ at one end of the capacitor in the vertical oscillator 23 and flyback pulses $Q_1$, $Q_2$ and $Q_3$. The waveforms shown are partly enlarged for explanatory purposes.

At a free-running frequency approximately equal to the field frequency, the flyback pulse $Q_1$ is generated synchronously with the excessive signal $P_{e1}$, before the vertical oscillator is triggered by the vertical trigger signal $P_1$. In this state, the capacitor of the time constant circuit starts discharging. Thus, the flyback pulse $Q_1$ is generated earlier than the normal occurence period. On the other hand, the pulse $P_1$ is applied to the vertical oscillator to again discharge the capacitor. This prolongs the time for the capacitor voltage to reach Eu, with the result that the width of the pulse $Q_1$ is increased. After discharging, the capacitor starts charging again. When the capacitor voltage approaches $E_L$ as charging progresses, the pulse $Q_2$ is generated synchronously with the vertical trigger signal $P_2$ and has a time width corresponding to the flyback time. Because the time taken by the capacitor voltage to reach $E_U$ is prolonged, the voltage $R_1$ is kept high at the time corresponding to excessive signal $P_{e2}$ which does not cause the triggering of vertical oscillator 23; therefore, normal synchronism is established in the next field at the vertical trigger signal $P_2$ to enable the flyback pulse $Q_2$ to be present for a normal period. In the subsequent field, however, the oscillator is triggered by the excessive signal $P_{e3}$ due to the equalizing pulse component effected before the arrival of the vertical trigger pulse $P_3$, resulting in an early occurence of a prolonged pulse $Q_3$ as in the case of the vertical trigger pulse $P_1$. In other words, normal synchronism is maintained only in the fields of even turns as shown in FIG. 3. Unless this problem is solved it is impossible to prevent jittering of pictures reproduced on the screen of a television receiver.

SUMMARY OF THE INVENTION

It is an object of the invention to provide a vertical deflection circuit capable of preventing jitter and abnormal triggering from occurring.

With this and other objects in view, the invention provides a vertical deflection circuit used in television receivers, comprising a free-running saw-tooth-wave generator capable of synchronous oscillation triggered by a vertical synchroning pulse separated from a composite synchronizing signal, the vertical deflection circuit utilizing a switch means which cuts off the composite synchronizing signal at least for the period from the time when the vertical oscillator is triggered to the end of the vertical synchronizing pulse period present in the composite synchronizing signal.

According to the invention, the pulse width and timing of the flyback pulse is not varied by the equalizing pulse. Thus, it becomes possible to prevent jittering of the vertical oscillation, i.e., jittering on the picture screen in the vertical direction.

BRIEF DESCRIPTION OF THE DRAWING

FIG. 2 (b) is a wavefrom diagram showing an output of the integrator;

DESCRIPTION OF THE PREFERRED EMBODIMENTS

Figure 4:
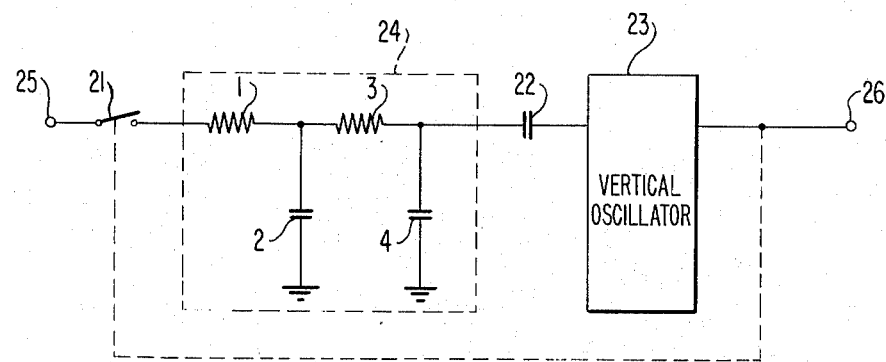
FIG. 4 is a diagram showing the fundamental circuit of the circuit according to this invention.

Referring now to FIG. 4, the fundamental circuit of a vertical deflection circuit of the invention comprises an input terminal 25, a switch 21, an integrator circuit 24, vertical oscillator 23 and output terminal 26. A resistor 1, capacitor 2, resistor 3, and capacitor 4 constitute an integrator circuit 24 comprising two cascaded integrators. The output of the integrator circuit 24 is coupled to a vertical oscillator 23 through a coupling capacitor 22. A switch 21 is located between the input terminal 25 and the integrator circuit 24 and controlled by the output of the vertical oscillator 23. Thus this switch is capable of preventing the composite synchronizing signal from being applied to the integrator circuit 24, at least for the period from the time when the vertical oscillator has been triggered to the end of the vertical synchronizing pulse period present in the composite synchronizing signal. This period should be equal to or shorter than the flyback pulse period.

Figure 5:
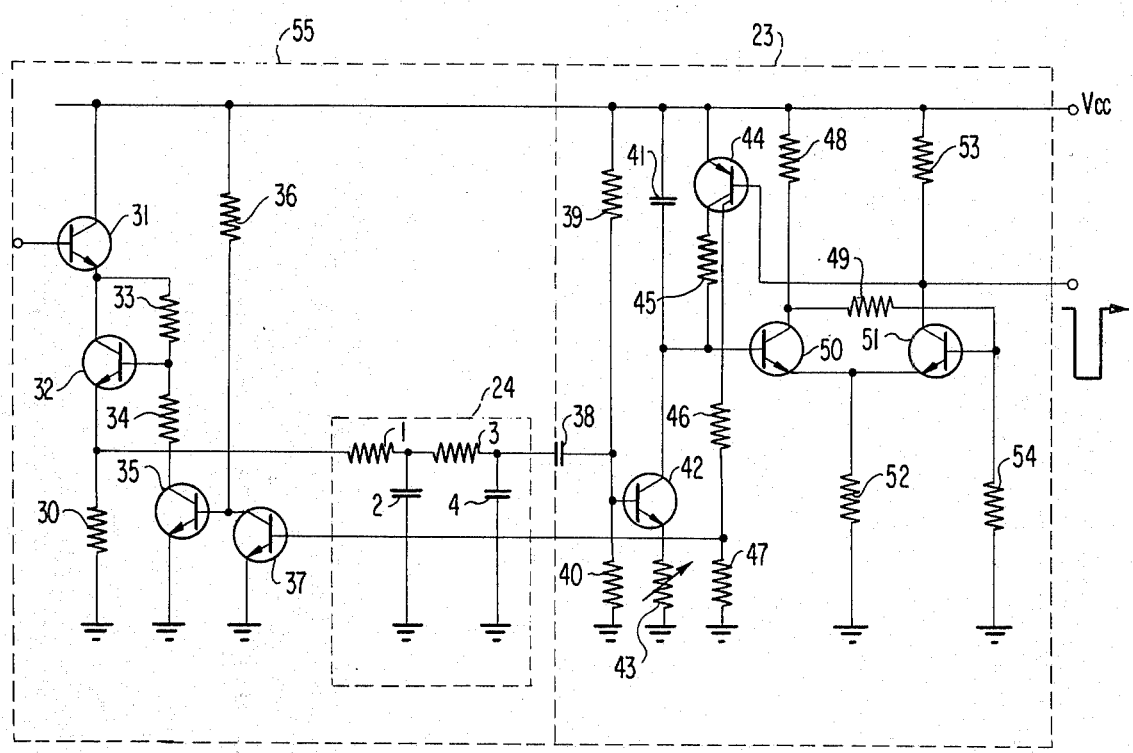
FIGS. 5, 6 and 7 are circuit diagrams showing respectively first, second and third embodiments of the invention.

FIG. 5 shows first embodiment of the invention realized according to the principle illustrated in FIG. 4. In FIG. 5, a composite synchronizing signal is applied to the base of transistor 31 serving as buffer amplifier and then applied to an integrator 24 which is operated for vertical synchronizing separation, through a transistor 32 which serves as the switch 21 shown in FIG. 4.

The integrator 24 is of two-stage integrating circuit comprising a resistor 1 and capacitor 2, and a resistor 3 and capacitor 4. The output of this integrator 24 is coupled to the synchronizing input terminal of a relaxation oscillator which will be described below.

The output of the integrator 24 is connected to the base of a transistor 42 through a capacitor 38, and a vertical trigger signal is applied to the vertical oscillator. This transistor serves as a constant current source for charging a capacitor 41. When a vertical trigger signal comes in, the transistor 42 rapidly charges the capacitor 41. The emitter circuit of the transistor 42 has a variable resistor 43 for adjusting the time for which the capacitor 41 is charged, i.e., for adjusting the free-running oscillation frequency of the relaxation oscillator. The resistors 39 and 40 give a bias potential to the base of the transistor 42.

Transistors 50 and 51 and resistors 48, 49, 52, 53 and 54 constitute a Schmitt trigger circuit. The base of the transistor 50, serving as the input terminal of the Schmitt trigger circuit, is connected to the junction between the capacitor 41 and the collector of the transistor 42 so that the voltage charged across the capacitor 41 is sensed by the transistor 50. A transistor 44 connected across the capacitor 41 through a resistor 45 controls the discharge of the capacitor 41 and the operation of the transistor 32 which serves as a switch. The multicollector transistor 44 has its base connected to the collector of the transistor 51 which serves as the output terminal of the Schmitt trigger circuit. One of the collectors of the transistor 44 is connected to the base of the transistor 50 through the resistor 45 so that the charge in the capacitor 44 is periodically discharged.

The other collector of the transistor 44 is connected to the base of the transistor 37 through the voltage divider of the resistors 46 and 47. Then, the change in the collector voltage of the transistor 44 is transmitted to the base of the switch transistor 32 through transistors 37 and 35. The resistor 36 is connected between the power source line and the collector of the transistor 37. The resistors 33 and 34 operate as the load of the transistor 35 and give a base-emitter voltage of the transistor 32 by their voltage dividing action.

Figure 1:
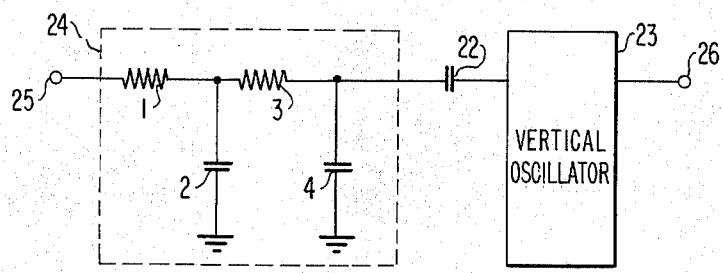
FIG. 1 is a circuit diagram of a conventional vertical deflection circuit.
Figure 2:
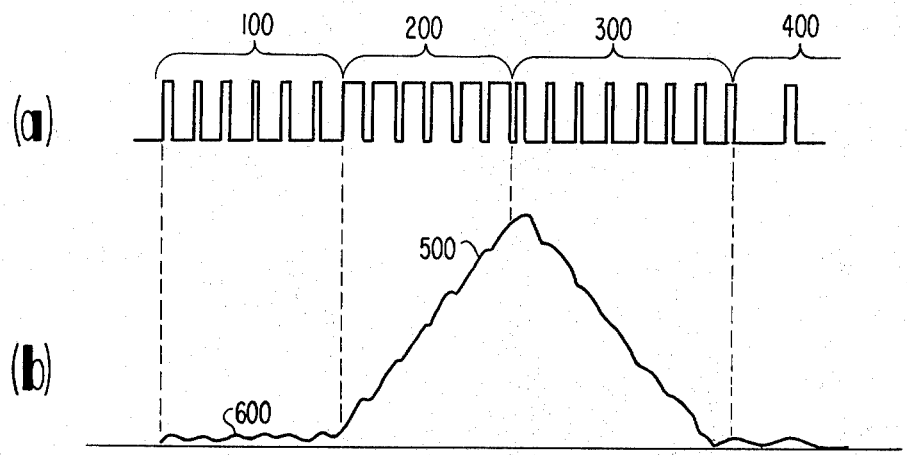
FIG. 2 (a) is a waveform diagram showing a composite synchronizing signal.
Figure 3:
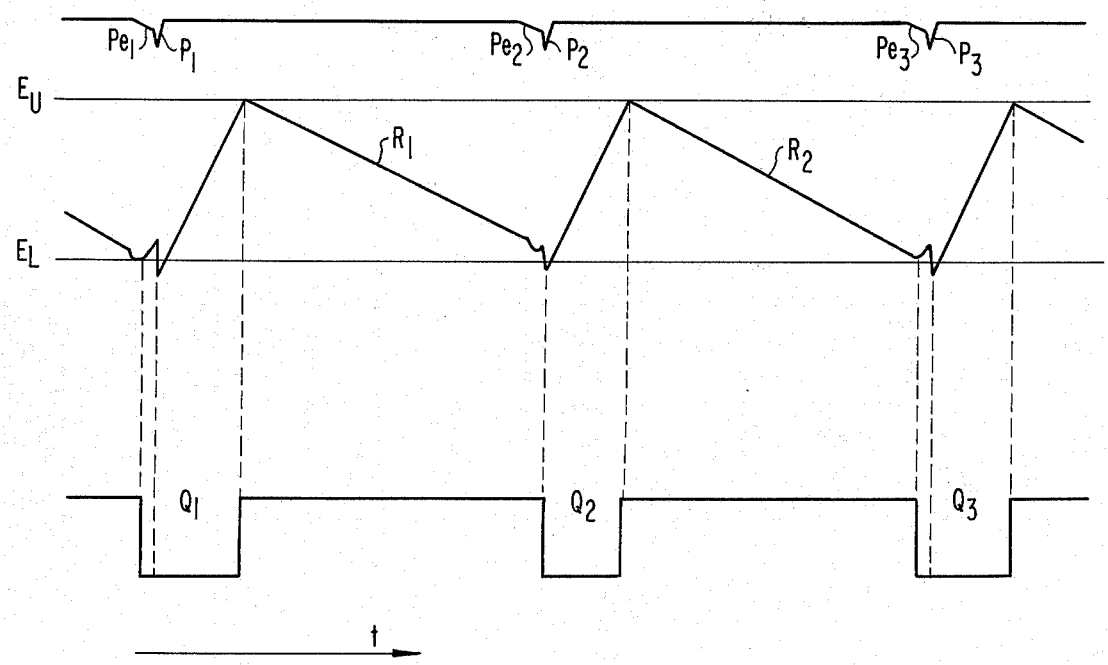
FIG. 3 is a diagram for illustrating a relationship among the vertical trigger pulses, the potential at one end of a capacitor in the vertical oscillator and the flyback pulse.

In the operation of this circuit, assume that the voltage at the point between capacitor 41 and the collector of the transistor 42 decreases down to the value nearly equal to the voltage ($E_L$ in FIG. 3) at which the transistor 50 is cut off. In this state, when a vertical trigger signal ($P_i$ in FIG. 3) comes in, the transistors 50 and 51 of the schmitt trigger circuit respectively turns off and on, to cause the collector voltage of the transistor 51 to fall. As a result, the transistor 44 turns on, and the charge across the capacitor 41 is quickly released. At that time, the transistor 37 connected to the collector of the transistor 44 turns on, and the transistor 35 turns off. Therefore, the transistor 32 which operates as a switch against the composite synchronizing signal turns off. After this step of operation, no composite synchronizing signal is applied to the integrator, and thus the vertical oscillator operates free from the affect of the composite synchronizing signal. As a consequence, the discharging time from the capacitor 41 depends on only the difference between the discharging current from the transistor 44 and the constant charging current from the transistor 42 whereby all the flyback pulse widths are kept uniform, and no jitter appears on the picture screen. In more detail, even if the vertical oscillator 23 is triggered by the excessive signal due to the equalizing pulse, the flyback pulse width is not prolonged. The oscillator 23 is triggered by the next excessive pulse. Thus, jitter is effectively eliminated.

When the capacitor 41 continues discharging to cause its terminal voltage to reach a value equal to the voltage $E_U$ (in FIG. 3) at which the transistor 50 turns on, the transistor 51 turns off, the capacitor 41 starts charging by the constant current supplied from the transistor 42. At the same time, the transistor 44 turns off to cause the transistors 37, 35 and 32 to turn off, on and on, respectively, and thus the following composite synchronizing signal is applied to the integrator 24 for vertical synchronizing separation.

Thus, the vertical deflection circuit operates to eliminate jitter on the picture screen, even if the verrical oscillator is triggered by excessive signal due to the equalizing pulse. This advantage is very effective in the case of receiving a weak signal. In such case, the vertical deflection circuit is easily affected by the noise such as excessive signal, because the frequency of the free-running saw-tooth-wave generator is set at around the field frequency so that the free-running generator may be triggered by a weak vertical trigger signal.

When the synchronous operation of the deflection circuit with the vertical synchronizing is broken, the variable resistor 43 is adjusted to control the frequency of the Schmitt trigger circuit to restore the synchronous operation of the deflection circuit.

Figure 6:
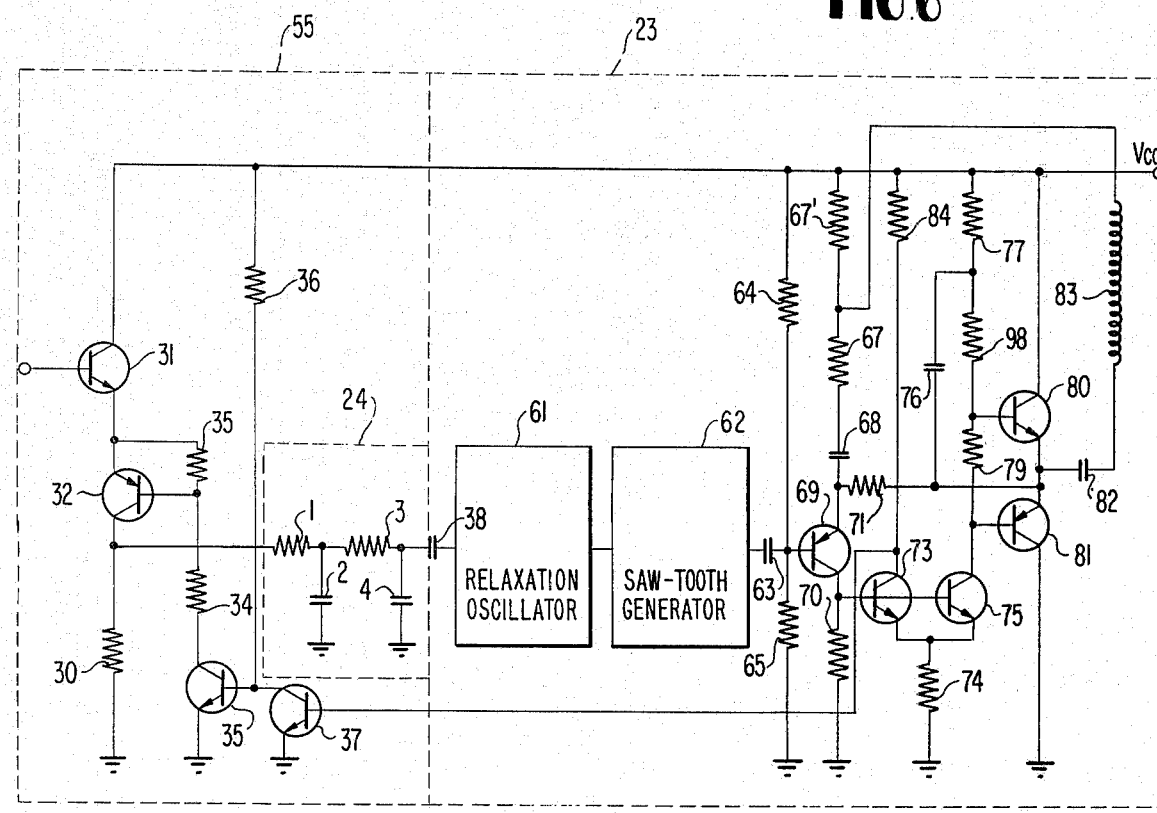

Referring to FIG. 6, a circuit diagram according to a second embodiment of the invention is shown. The part encircled by the dotted line 55 is constructed and operated in the same manner as in FIG. 5 (the circuit elements and numerals are the same as in FIG. 5). In FIG. 6, there are provided a relaxation oscillator 61, and a circuit 62 for converting the output of the oscillator 61 into a saw-tooth wave signal.

The subsequent stage to the circuit 62 is a vertical deflecting output amplifier, of which the output is supplied to a deflecting coil 83 through a capacitor 82. The output of the circuit 62 is fed to the transistor 69 through a coupling capacitor 63. The resistors 64 and 65 apply a base bias voltage to the transistor 69. The output of the transistor 69 is applied across the resistor 70 and fed to the transistors 73 and 75 the emitters of which are grounded through the resistor 74. These transistors 73 and 75 remain off during the period of flyback pulse. The output of the transistor 75 is amplified by the circuit constituted by the transistors 80 and 81, and resistors 77, 79 and 98. The capacitor 76 is used for obtaining a boot-strap effect. The resistor 71 gives an emitter bias and feedback effect to the transistor 69. One end of the deflecting coil 83 is connected to the resistors 67 and 67', and capacitor 68 is inserted between the resistor 67 and the transistor 69.

The transistor 73 generates a signal for controlling a switch transistor 32 to cause the switch transistor 32 to turn of during the flyback pulse in the same manner as the above mentioned first embodiment. A resistor 84 acts as a load of the transistor 73.

Figure 7:
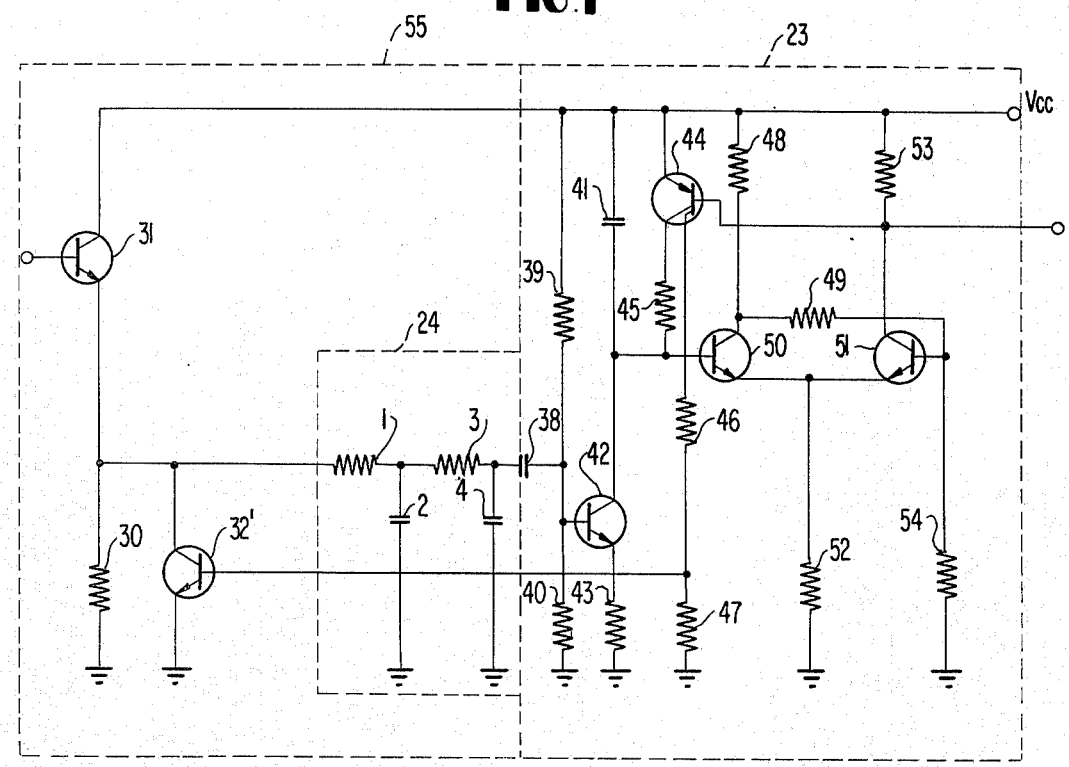

FIG. 7 is a circuit diagram showing a third embodiment of the invention. Like constituent components are indicated by the identical reference numerals in FIGS. 5 and 7. In this embodiment, a composite synchronizing signal transmitted to an emitter of a transistor 31 is short-circuited to a ground potential by a switching transistor 32' and thus inhibited from being transmitted to the integrator comprising resistors 1 and 3, capacitors 2 and 4. According to this embodiment, the same effects available with the arrangement shown in FIG. 5 can be obtained by the use of constituent elements smaller in number than according to the first embodiment of FIG. 5.

Thus, as has been described, this invention makes its circuit able to eliminate the occurrence of abnormal synchronism caused when the free-running frequency is approximately coincident with the frequency of the vertical synchronizing signal.

In the above description, some detailed embodiments have been shown. It is, however, apparent that other circuit arrangement can be available according to this invention. For example, the switch means is not only located immediately before the integrator 24 as shown in FIG. 4 but may be installed at a position between the composite synchronizing signal separation circuit and the triggering circuit for the vertical deflection circuit, since this switch means is used for interrupting the application of the vertical synchronizing pulse of the composite synchronizing signal to the triggering circuit.

What is claimed is:

1. A vertical deflection circuit for a television receiver comprising:
   an input terminal receiving a composite synchronizing signal having a group of vertical synchronizing pulses;
   means for producing a vertical trigger signal from said composite synchronizing signal fed through said input terminal;
   a free-running oscillator capable of synchronous oscillation triggered by said vertical trigger signal, said free-running oscillator producing an output comprising vertical scanning period signals and vertical flyback period signals; and
   a switching circuit located between said input terminal and said means for producing a vertical trigger signal, said switching circuit being adapted to prevent the application of said composite synchronizing signal to said means for producing a vertical trigger signal in response to said flyback period signals and to allow the application of said composite synchronizing signal to said means for producing a vertical trigger signal in response to said vertical scanning period signals.

2. A vertical deflection circuit for a television receiver claimed in claim 1, wherein said switching circuit has a first terminal coupled to said input terminal, a second terminal coupled to said means for producing a vertical trigger signal, and a control terminal receiving said output of said free-running oscillator.

3. A vertical deflection circuit for a television receiver claimed in claim 2 wherein said switching means comprises a first transistor having its base connected to said input terminal and serving as a buffer amplifier and a second transistor connected in series with the emitter circuit of said first transistor, said second transistor having its base connected to the output of said free-running oscillator and serving as a switch.

4. A vertical deflection circuit for a television receiver claimed in claim 3 wherein the emitter of said first transistor is connected to the collector of said second transistor and the emitter of said second transistor is connected to said means for producing a vertical trigger signal.

5. A vertical deflection circuit for a television receiver claimed in claim 1 wherein said switching means comprises a first transistor having it its base connected to said input terminal and serving as a buffer amplifier, the emitter of said first transistor being connected to said means for producing a vertical trigger signal, and a second transistor connected on shunt with the input of said means for producing a vertical trigger signal, said second transistor having its base connected to the output of said free-running oscillator and serving as a switch.

* * * * *

UNITED STATES PATENT AND TRADEMARK OFFICE
CERTIFICATE OF CORRECTION

PATENT NO. : 4,001,715
DATED : January 4, 1977
INVENTOR(S) : Hirokazu FUKAYA

It is certified that error appears in the above-identified patent and that said Letters Patent are hereby corrected as shown below:

Column 1, line 50 - delete "$P_{el}$" (letter) insert - $P_{e1}$ - (numeral)

Column 2, line 6 - delete "occurence" insert - occurrence - line 10 - after "solved" insert -- , -- line 22 - delete "synchroning" insert - synchronizing

Column 3, line 7 - after "serving as" insert - a - line 61 - delete "schmitt" insert - Schmitt -

Column 4, line 26 - delete "verrical" insert - vertical - line 68 - delete "of" insert - off -

Column 5, line 23 - delete "arrangement" insert - arrangements -
Column 6, line 35 - after "having" delete "it".

Signed and Sealed this second Day of August 1977

[SEAL]

Attest:

RUTH C. MASON
Attesting Officer

C. MARSHALL DANN
Commissioner of Patents and Trademarks